United States Patent [19]

Suzuki et al.

[11] Patent Number: 4,547,770
[45] Date of Patent: Oct. 15, 1985

[54] BATTERY VOLTAGE CHECKING APPARATUS

[75] Inventors: Ryoichi Suzuki, Kanagawa; Ryuji Tokuda, Tokyo, both of Japan

[73] Assignee: Canon Kabushiki Kaisha, Tokyo, Japan

[21] Appl. No.: 510,346

[22] Filed: Jul. 1, 1983

[30] Foreign Application Priority Data

Jul. 8, 1982 [JP] Japan .................................. 57-11949

[51] Int. Cl.$^4$ ......................... G08B 21/00; G03B 7/26
[52] U.S. Cl. ..................................... 340/636; 354/468
[58] Field of Search ....................... 340/636; 354/468; 320/48

[56] References Cited

U.S. PATENT DOCUMENTS 4,269,494 5/1981 Shiozawa et al. .................... 354/468

Primary Examiner—James L. Rowland
Assistant Examiner—Daniel Myer
Attorney, Agent, or Firm—Toren, McGeady, Stanger, Goldberg & Kiel

[57] ABSTRACT

In the disclosed battery voltage checking apparatus a first detector detects a first battery voltage level and a second detector detects a second battery voltage level. The first detector produces a signal to instruct the operator to replace the battery when the voltage level of the battery is below the first battery voltage level. Another signal is produced to inhibit camera operation when the battery voltage is below the second battery voltage level. The apparatus includes a circuit arranged to cause the first and second detectors to simultaneously detect the battery voltage level and another circuit arranged to process the signal produced from the first detector before processing the signal from the second detector.

7 Claims, 2 Drawing Figures

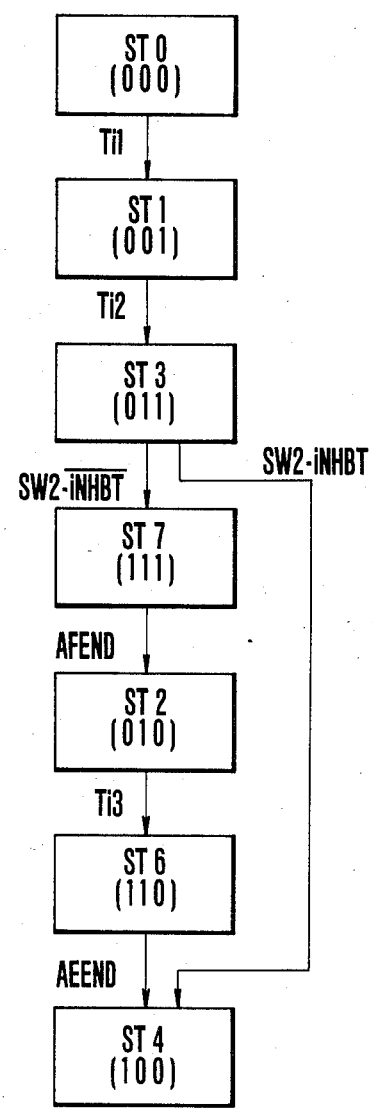
F I G. 1

BATTERY VOLTAGE CHECKING APPARATUS

BACKGROUND OF THE INVENTION

1. Field of the Invention

This invention relates to battery voltage checking apparatuses and methods, and particularly to battery voltage checking apparatuses and methods (or BC apparatuses and methods) for a camera using a battery as a power source.

2. Description of the Prior Art

In a known battery checking arrangement, two voltage levels are preset. One level is present to a value somewhat higher than a minimum voltage required for operating the device in which it is used, such as a camera, the other is set at a value close to the minimum operating voltage. The system provides a warning concerning the battery's energy consumption as a result of a determination made on the basis of the former level, i.e., the warning level. Erroneous camera action is prevented by inhibiting operation in response to a determination made on the basis of the latter level, i.e. the inhibiting level.

Cameras employing batteries generally use a silver battery of small capacity. Therefore, after a power source switch (hereinafter identified as switch SW1) is closed, the source voltage tends gradually to decrease. If a system determines the output voltage level of the battery when the source switch SW1 is closed, it cannot detect the battery's energy consumption state that ensues. To avoid this problem a conventional battery checking method does not make a determination based on the inhibiting level immediately after the switch SW1 is closed but accomplishes this by allowing a battery voltage checking load current momentarily to flow after a predetermined lapse of time from the closing of the source switch SW1, but only after closing of a shutter release switch (which may be called the switch SW2).

However, it is necessary to warn a user concerning the battery's energy consumption condition before carrying out an inhibiting action. Therefore, a determination based upon the warning level is made prior to and not after the closing of the switch SW2. For example, a battery voltage checking load current is allowed to flow when a switch which is specifically provided for checking the battery voltage is closed.

In conventional devices, two level determining actions are performed at different times as mentioned. However, such a conventional arrangement results in a complex battery checking circuit. Besides, the time difference between the two level-determining action makes it difficult to determine the output of the battery in the same condition. Thus, there is the possibility that the inhibiting action might be performed prior to a warning display, that is, the display of the result of the determination might be reversed. More specifically, while the battery voltage may be determined to be normal during the warning level test, at the time of the ensuing inhibiting level determination, the result may be the reverse of the warning level determination and may represent an inhibiting level which is lower than the warning level due, for example, to a temporary overload or the like. In such a case, the camera's operation has been inhibited prior to a warning display or annoucement to replace the battery. This is a serious problem in a system like a photographic camera which is required to inform the operator in advance of the need to replace a battery.

SUMMARY OF THE INVENTION

It is an object of the present invention to provide a BC method and apparatus in which the operator is informed without fail of the necessity of replacing a battery prior to an inhibiting action when the voltage of the battery is below a prescribed value.

The above and further objects and features of the invention will become apparent from the following detailed description of a preferred embodiment thereof taken in conjunction with the accompanying drawings.

BRIEF DESCRIPTION OF THE DRAWINGS

FIG. 1 is a flow chart showing the operation of a camera to which the present invention is applied.

DESCRIPTION OF THE PREFERRED EMBODIMENT

Figure 2:
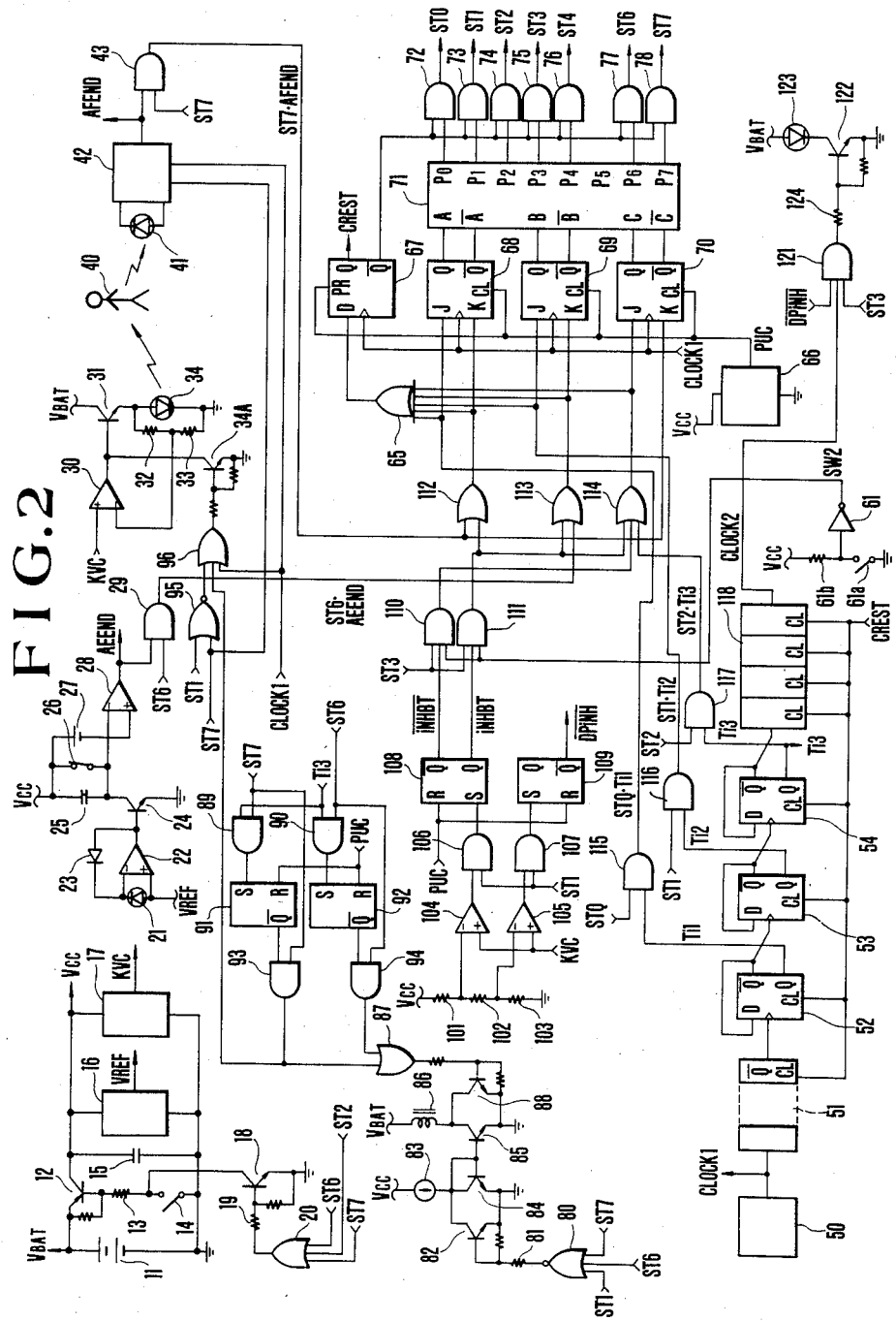
FIG. 2 is an electric circuit diagram of the camera shown in FIG. 1.

A camera to which the present invention is applied operates as shown in the flow chart of FIG. 1. In FIG. 1, the camera is in a state ST0 which lasts over a prescribed period from closing of a power source switch till stabilization of the power source. Checking for power source voltage which is called battery voltage check is performed during the period of a state ST1. In a state ST3, a shutter release signal SW2 is in stand-by. When the output of the battery is found normal by the battery voltage check, the camera produces a display indicative thereof (hereinafter called the OK display).

In the case of an OK display after the battery voltage check with the shutter release signal SW2 in the stand-by, the OK display is made during the state ST3. A state ST7 is a period during which an automatic focusing (AF) action or a distance measuring action is carried out. This state obtains when no inhibiting signal is produced at the time of battery voltage check after the shutter release signal SW2 is produced. A state ST2 is a stand-by period after completion of the AF action and before commencement of a shutter opening-and-closing operation. When an in-focus signal (an AF END signal) is produced during the state ST7, the operating sequence of the camera shifts to the state ST2. A state ST6 is a shutter control period. The camera shifts to this state after the lapse of the stand-by period of the state ST2.

Another state ST4 is an end state. The camera shifts to this end state either when an exposure completion signal (AE END signal) is produced in the state ST6 or when the power source voltage is found below a prescribed value, the battery voltage check in the state ST1 thus resulting in an inhibiting or inhibit signal iNHBT, and the signal SW2 is produced in the state ST3.

As described later, with reference to FIG. 2, the inhibit signal iNHBT is latched in the state ST1 and the operation sequence is varied by this latched signal at the time of generation of the signal SW2 in the state ST3 in this specific embodiment of the invention.

In to FIG. 2, the camera includes a power source battery 11 to be checked for its output voltage. A pnp transistor 12 which is provided for latching the power source has its base connected via a resistor 13 to a normally open switch 14 which corresponds to the switch SW1 and is arranged to close in response to the first step in the stroke of a shutter release button (not shown). A capacitor 15 which is provided for coupling the power source is connected to the collector of the transistor 12. A circuit 16 is arranged to produce a reference voltage VREF be described later. Another circuit 17 is arranged to produce a standard voltage KVC. An npn type switching transistor 18 is connected in parallel to the above-stated switch 14. The base of the transistor 18 is connected to the output terminal of a three-input OR gate 20 via a resistor 19.

An operational amplifier 22 (hereinafter an operational amplifier is called an OP amp.) is provided for light measurement. Both input terminals of the OP amp. 22 are connected to a photo-galvanic element 21 (hereinafter called SPC 21) which is also provided for light measurement.

A logarithmic suppression diode 23 is connected to the negative feedback line of the OP amp. 22. A transistor 24 serves for expansion and has its base connected to the output terminal of the OP amp. 22. A time constant capacitor 25 is connected to the collector of the expanding transistor 24. A normally closed switch 26 which is arranged to cause a count to begin is connected in parallel to the time constant capacitor 25. The switch 26 is arranged to open in response to the start of an opening action of the shutter. A comparator 28 has its negative terminal "−" connected to the collector of the above-stated expanding transistor 24 and its positive terminal "+" connected to a power source Vcc via a standard voltage source 27 which is arranged to produce a voltage lower than that of the power source Vcc. A two-input AND gate 29 has one of its input terminals arranged to receive a signal AEEND produced from the above-stated comparator 28. The other input terminal of the AND gate 29 is arranged to receive a signal ST6 to be described later. An OP amp. 30 forms a constant voltage circuit. The above-stated standard voltage KVC is supplied to the input terminal "+" of the OP amp. 30. A driving transistor 31 is connected to the output terminal of the OP amp. 30 and is arranged to drive an infrared ray emitting diode (hereinafter called iRED) 34. The emitter of the driving transistor 31 has the iRED 34 and series resistors 32 and 33 connected thereto. Further, the voltage dividing point of the series resistors 32 and 33 is connected to the input terminal "−" of the OP amp. 30.

A reference numeral 40 indicates an object to be photographed. A light measurement element 41 is arranged to measure a distance between the camera and the object 40 (hereinafter the light measurement element 41 is called the light measurement element for AF which means automatic focusing). A known AF circuit 42 is arranged to compute and process the output of the light measurement element 41 and to produce an in-focus signal AFEND. A two-input AND gate 43 has one of its input terminals arranged to receive the signal AFEND and the other input terminal to receive a signal ST7 which will be described later herein.

An oscillation circuit 50 is arranged to produce a signal CLOCK 1. The signal CLOCK 1 is supplied to a frequency dividing circuit 51 of a next stage. The output $\overline{Q}$ of the frequency dividing circuit 51 is supplied to a D-flip-flop 52 (hereinafter called D-FF) of a next stage. The output $\overline{Q}$ of the D-FF 52 is supplied to D-FF 53 of a subsequent stage. The output $\overline{Q}$ of the D-FF 53 is supplied to a next D-FF 54. The output terminal of the D-FF 54 has a four-step frequency dividing circuit 118 connected thereto. The frequency dividing circuit 118 produces a signal CLOCK 2 from its output terminal.

These frequency dividing circuits 51 and 118 and the D-FF's 52–54 respectively have their clear terminals arranged to receive a signal CREST which will be described later herein. A two-input AND gate 115 has one of its input terminals arranged to receive the output Q of the D-FF 52 and the other input terminal arranged to receive a signal ST0 which will be described later herein. Another two-input AND gate 117 has one of its input terminals arranged to receive the output Q of the D-FF 54 and the other input terminal arranged to receive a signal ST2 which will be described later herein. A further two-input AND gate 116 has one of its input terminal arranged to receive the output Q of the D-FF 53 while the other input terminal thereof is arranged to receive a signal ST1 which will be described later herein. Resistors 101, 102 and 103 are series connected for voltage dividing. A comparator 104 is provided for determining the inhibiting level of the battery voltage and another comparator 105 for determining the warning level of the battery voltage. The input terminal "−" of the comparator 104 is connected to a voltage dividing point between the resistors 101 and 102 which is arranged to produce a voltage somewhat higher than the lowest voltage required for operating the camera. The input terminal "−" of the comparator 105 is connected to a voltage dividing point between the resistors 102 and 103 which is arranged to produce the lowest camera operating voltage. Meanwhile, the input terminals "+" of both the comparators 104 and 105 are arranged to receive a standard voltage KVC.

Two-input AND gates 106 and 107 are arranged to have one of their input terminals connected respectively to the output terminals of the above-stated comparators 104 and 105 while their other input terminals are arranged to receive the signal ST1 which will be described later. These gates 106 and 107 together with an AND gate 73, a decoder 71, etc. form circuitry for enabling the comparators 104 and 105 which form a voltage detector to simultaneously detect the output voltage of the battery 11. RS-FF (RS flip-flop) circuits 108 and 109 are arranged to process the result of the warning level determination or, more specifically stated, to have a display action performed on the basis of the result of the warning level determination always before the result of the inhibiting level determination is processed. Each of these RS-FF circuits 108 and 109 is arranged to receive a signal PUC which will be described later herein at its reset input terminal. Meanwhile, the outputs of the AND gates 106 and 107 are supplied to the set input terminals of these RS-FF circuits. Reference numerals 110 and 111 indicate three-input AND gates which are arranged to receive respectively the output $\overline{Q}$ (iNHBT) and the output Q (iNHBT) of the RS-FF 108 at one of their input terminals. Other input terminals of both the AND gates 110 and 111 are arranged to receive the signal ST3. A normally open switch 61a which corresponds to the switch SW2 mentioned in the foregoing is arranged to close in response to the second step or position in the stroke of the shutter release button of the camera.

To the connection point between the switch 61a and a resistor 61b is connected an inverting circuit 61 which is arranged to have its output supplied to the above-stated AND gates 110 and 111. A two-input OR gate 112 has its input terminals connected to the above-stated AND gate 111 and another AND gate 43 which will be described later. A two-input OR gate 113 has its input terminals connected to the AND gate 111 and the output terminal of the gate 29. A three-input OR gate 114 has its input terminals connected to the output terminals of AND gates 111, 110 and 117. A five-input OR gate 65 is arranged to receive the outputs of the AND gate 115, OR gate 112, AND gate 116 and OR gates 113 and 114. A D-FF 67 has the input terminal D thereof arranged to receive the output of the OR gate 65 while the output signal CLOCK 1 of the above-stated oscillation circuit 50 is applied to the clock input terminal of the D-FF 67. Reference numerals 68, 69 and 70 indicate JK-FF's (flip-flop circuit). The JK-FF 68 has its input terminal J arranged to receive the output of the AND gate 115 and its input terminal K to receive the output of the OR gate 112. The JK-FF 69 is arranged to have the output of the above-stated AND gate 116 applied to its input terminal J and the output of the OR gate 113 to its input terminal K. The JK-FF 70 is arranged to have the output of the OR gate 114 applied to its input terminal J and the output of the above-stated AND gate 43 to its input terminal K. A known power up clear signal producing circuit 66 is arranged to produce a one-pulse signal PUC when the power source is switched on. This signal PUC is supplied to the preset input terminal of the D-FF 67, to the clear input terminals of the JK-FF's 68–70 and to the reset terminals of the RS-FF's 91, 92, 108 and 109.

A decoder circuit 71 is arranged to convert the binary outputs of the JK-FF's 68–70 into decimal codes. Two-input AND gates 72–78 are arranged to have the outputs of the decoder 71 supplied to one of their input terminals. The output $\overline{Q}$ of the above-stated D-FF 67 is applied to the other input terminals of these AND gates 72–78. These AND gates 72–78 are arranged to produce signals ST0–ST7 from their output terminals.

The camera is provided with a coil 86 of a magnet for automatic focusing and shutter control. A transistor 88 is arranged to drive the magnet with an attracting current. Transistors 84 and 85 are provided for driving the magnet with a holding current and are arranged to form a current mirror. A constant current circuit 83 is connected to the collector of the transistor 84. A switching transistor 82 has its base connected to the output terminal of a NOR gate 80 via a resistor 81. The three input terminals of the NOR gate 80 are arranged to receive the above-stated signals ST1, ST6 and ST7. AND gates 89 and 90 are of the two-input type. Each of the AND gates 89 and 90 is arranged to have a signal Ti3 which is produced from the output terminal Q of the D-FF 54 applied to one of the input terminals thereof. The other input terminals of the AND gates 89 and 90 are arranged to receive the signals ST7 and ST6 respectively. Numerals 91 and 92 indicate RS-FF circuits. Their set input terminals are arranged to receive the outputs of the above-stated AND gates 89 and 90. The reset input terminals of the RS-FF circuits 91 and 92 are arranged to receive the above-stated signal PUC.

Two-input AND gates 93 and 94 are arranged to have one of their input terminals connected to the output terminals $\overline{Q}$ of the above-stated RS-FF circuits 91 and 92. Meanwhile, the other input terminals of the AND gates 93 and 94 are arranged to receive the signals ST7 and ST6 respectively. The outputs of the AND gates 93 and 94 are supplied to the input terminals of a two-input OR gate 87. The output terminal of the OR gate 87 is connected via a resistor to the base of the above-stated attracting current driving transistor 88. The signals ST2, ST6 and ST7 are supplied to the three input terminals of the above-stated OR gate 20. A numeral 121 indicates a three-input AND gate. The output $\overline{\text{DPiNH}}$ of the output terminal $\overline{Q}$ of the above-stated RS-FF 109, the output signal CLOCK 2 of a frequency dividing circuit 118 and the signal ST3 are supplied to the AND gate 121. A switching transistor 122 has its base connected via a resistor 124 to the output terminal of the above-stated AND gate 121. Meanwhile, the collector of the switching transistor 122 is connected to an LED 123 which is arranged to indicate that the battery voltage is normal (hereinafter this state will be called BCOK).

The camera which is arranged as has been described above operates as follows:

The mechanical arrangement of the camera is identical with a camera disclosed in U.S. patent application Ser. No. 349,963 of Feb. 18, 1982, therefore, is omitted from description herein. When the above-stated switch 14 closes in response to the first stroke of the shutter release button (not shown) of the camera, the power source latching transistor 12 turns on. A voltage Vcc is produced. Then, each circuit shown in FIG. 2 receives a power supply. The pulse-like signal PUC is produced from the power up clear circuit 66. The D-FF 67 is preset. The output terminals Q and $\overline{Q}$ of the D-FF 67 are thus set at a high level (hereinafter called an H level) and at a low level (hereinafter called an L level) respectively. The JK-FF's 68–70 are cleared and their output terminals Q and $\overline{Q}$ are set respectively at an L level and an H level. As a result of this, among the output terminals of the decoder 71, the level of the output PO solely becomes an H level while those of other output terminals of the decoder 71 are at an L level.

Since the output $\overline{Q}$ of the D-FF 67 has been set at the L level at that time as mentioned above, all the outputs of the AND gates 72–78 are at an L level. None of the signals ST0–ST7 are therefore produced. Accordingly, all inputs of the OR gate 65 are at an L level and the output thereof is also at an L level. Therefore, when the signal CLOCK 1 rises next time, it causes the output Q (CREST) and the output $\overline{Q}$ of the D-FF 67 to change respectively to an L level and an H level. Since the output PO of the decoder 71 is kept solely at an H level, the output level of the AND gate 72 changes to an H level. This causes the signal ST0 to be produced to shift the camera to the state 0. The frequency dividing circuit 51 and the D-FF's 52–54 are arranged to be released from their cleared state by the disappearance of the signal CREST as mentioned in the foregoing. Therefore, at that instant, the frequency dividing circuit 51 and the D-FF's 52–54 begin to count. When this counting action progresses to cause the output level of the output terminal Q of the D-FF 52 to change to an H level, the output of the AND gate 115 changes to an H level and the input J of the JK-FF 68 becomes an H level because the level of the signal ST0 has become an H level. Therefore, when the signal CLOCK 1 again rises, the output level of the output terminal Q of the JK-FF 68 changes to an H level. As a result of this, the output P1 of the decoder 71 is solely kept at an H level among other outputs of the decoder. Further, when the output level of the AND gate 115 becomes an H level, the output level of the OR gate 65 becomes an H level. Therefore, when the signal CLOCK 1 rises next time, the level of the output $\overline{Q}$ of the D-FF 67 becomes an L level. Then, the output levels of all the AND gates 72–78 become an L level. Then, the level of the output Q (CREST) of the D-FF 67 becomes an H level to reset the counters 51–54 and 118. The output level of the OR gate 65 also becomes an L level accordingly. A next rise of the signal CLOCK 1 then causes the level of the output $\overline{Q}$ of the D-FF 67 to change to an H level. Since one output of the decoder 71 is kept at an H level, the change to the H level of the output $\overline{Q}$ of the D-FF 67 causes the output level of the AND gate 73 to change to an H level. As a result of this, the signal ST1 is produced to shift the camera to the state 1.

With the signal ST1 produced, the output level of the NOR gate 80 changes to an L level to turn off the transistor 82. This causes a constant current of the constant current source 83 to flow through the current mirrors 84 and 85. This current is set at a value that never cause the magnet to attract an armature [not shown], so that the camera can be prevented from operating. Further, with the signal ST1 produced, the output level of the NOR gate 95 changes to an L level and the signal CLOCK 1 is produced from the OR gate 96. In synchronism with the signal CLOCK 1, the transistor 34A turns on and off in a repeating manner. As a result of that, the iRED 34 flickers in the same cycle as that of the transistor.

In this instance, the lighting voltage is kept unvarying by the negative feedback action of the OP amp. 30.

In the state 1, the signal ST1 causes an attracting current to flow to the magnet 86 and a flickering current to flow to the iRED 34. Thus, a checking action is performed on the battery 11 for its output voltage. Where the battery 11 and the power source voltage Vcc is not lowered much, the voltage at the voltage dividing point of the series resistors 101–103 is not lowered much and the "−" of the comparators 104 and 105 are higher than their "+" input voltage KVC. Therefore, the output level of each of the comparators is at an L level. Accordingly, the output levels of the AND gates 106 and 107 remain at an L level. The RS-FF's 108 and 109 also remain in their state of having been reset by the signal PUC when the power source was switched on. When a predetermined length of time has elapsed after the shift to the state 1, the output level of the output terminal Q of the D-FF 53 changes to an H level. The output level of the AND gate 116 also changes to an H level as the signal ST1 has been produced. The level of the input J of the JK-FF 69 therefore changes to an H level. Then, the output level of the output terminal Q of the JK-FF 69 changes to an H level when the signal CLOCK 1 rises next time. In other words, the levels of the inputs A and B of the decoder become an H level. This results in an H level of the output P3 of the decoder 71.

Accordingly, as has been described in the foregoing, the output level of the AND gate 75 becomes an H level at a next rise of the signal CLOCK 1. As a result, the signal ST3 is produced to shift the camera to the state 3. At that instant, also, the counter is again reset.

When the camera is shifted to the state 3 with the signal ST3 produced, the output $\overline{DPiNH}$ of the output terminal $\overline{Q}$ of the RS-FF 109 is at an H level. The AND gate 121 therefore produces the signal CLOCK 2. This signal causes the switching transistor 122 to turn on and off in a repeating manner. Accordingly, the LED 123 flickers to indicate that the battery voltage is normal. In the state 3, when the switch 61a closes in response to a shutter release operation of the camera, the level of the output SW2 of the inverting circuit 61 changes to an H level. Since the RS-FF 108 is in a reset state, the output level of the AND gate 110 changes to an H level. The high level output of the AND gate 110 is applied via the OR gate 114 to the input terminal J of the JK-FF 70. Therefore, the level of the output Q of the JK-FF 70 changes to an H level when the signal CLOCK 1 rises next time. Then, the level of the output P7 of the decoder 71 becomes an H level this time. The high level output P7 results in generation of the signal ST7 to bring about the state 7. The counter is again reset also in this instance.

Since the RS-FF 91 is reset by the signal PUC in the beginning, the level of its output $\overline{Q}$ has been at an H level. Therefore, with the signal ST7 produced, the output level of the AND gate 93 becomes an H level. Then, the attracting current flows to the magnet 86 with the transistor 88 caused to turn on by the high level output of the AND gate 93 via the OR gate 87. With the current flowing to the magnet, a mechanism which is not shown causes the lens barrel of the camera to move. The attraction by the magnet comes to an end when the signal Ti3 is produced from the D-FF 54. After that, the signal ST7 causes the constant current 83 to flow there as an attracting current. Further, with the signal ST7 produced, the output level of the NOR gate 95 changes to an L level. This causes the iRED 34 to flicker in the same manner as in the case of the signal ST1. However, since the output of the AND gate 93 is supplied to the OR gate 96, the transistor 34A turns on and the iRED 34 does not flicker during the period of flow of the attracting current to the magnet. A light produced from the iRED 34 is reflected by the object 40 to be photographed. The reflection light from the object comes to the SPC 41 and is processed by computation at the known AF circuit 42. After the lapse of a predetermined period, the circuit 42 produces a distance measurement completion signal (an AF END signal). As a result of that, the output level of the AND gate 43 changes to an H level. The H level output of the AND gate 43 is supplied to the input terminal K of the JK-FF 70 and also to the input terminal K of the JK-FF 68 via the OR gate 112. The levels of the outputs Q of the JK-FF's 68 and 70 thus change to an L levels at the time of a next rise of the signal CLOCK 1. Then, this time, the level of the input P2 alone goes to an H level at the decoder 71. As a result of this, the signal ST2 is produced to shift the camera to the state 2. When the signal ST7 disappears, the output level of the NOR gate 80 changes to an H level. The transistor 82 turns on and the transistor 85 turns off to cut off the holding current for the magnet 86. Then, a mechanism which is not shown brings the movement of the lens barrel to a stop. When a predetermined length of time has elapsed after the shift to the state 2, the level of the output Q of the D-FF 54 changes to an H level. After the signal ST2 is produced, the output level of the AND gate 117 changes to an H level. The H level output of the AND gate 117 is applied to the input terminal J of the JK-FF 70 via the OR gate 114. The level of the output Q of the JK-FF 70 changes to an H level when the signal CLOCK 1 rises next time. Therefore, the level of the output P6 of the decoder 71 becomes an H level to produce the signal ST6 and the state 2 shifts to the state 6. Since the RS-FF 92 has been initially reset by the signal PUC to have the output $\overline{Q}$ thereof at an H level, the output level of the AND gate 94 becomes an H level when the state 6 obtains. Accordingly, the output level of the OR gate 87 also becomes an H level. The transistor 88 turns on. The attracting current flows to the magnet 86 to cause the magnet to attract the armature. A mechanism which is not shown initiates an opening action on the shutter which is also not shown. When the level of the output Q (or the output Ti3) of the D-FF 54 changes to an H level a predetermined length of time after the shift to the state 6, the output level of the AND gate 90 changes to an H level because of the signal ST6. The RS-FF 92 is set by the high level output of the AND gate 90. The level of the output $\bar{Q}$ of the RS-FF 92 becomes an L level. The output level of the AND gate 94 also becomes an L level. The transistor 88 turns off to cut off the attracting current for the magnet 86. However, the output level of the NOR gate 80 is caused to become an L level by the generation of the signal ST6 and the transistor 82 turns off. Therefore, the holding current continues to flow to the magnet 86 to enable the shutter closing action to continue.

The count start switch 26 opens in response to the start of the above-stated shutter opening action. This causes the time constant capacitor 25 to be charged with the expanding current of the expanding transistor 24. When the level of the charge voltage reaches a prescribed value, the output level of the comparator 28 changes to an H level to produce the signal AEEND. Therefore, the output level of the AND gate 29 also changes to an H level to cause, via the OR gate 113, the level of the input terminal K of the JK-FF 69 to become an H level. Then, the level of the output Q of the JK-FF 69 changes to an L level when the signal CLOCK 1 again comes to rise. As a result of that, the level of the output P4 of the decoder 71 becomes an H level. The signal ST4 is thus produced to shift the camera to the state 4 (an END state). By this, one sequence of the camera operation comes to an end.

In the event of that the battery energy has been consumed to some extent and that the power source voltage Vcc drops to a value somewhat higher than the inhibiting level due to the holding current for the magnet 86 and the flickering current for the iRED 34 when the battery voltage check is made in the state 1, the camera operates as follows: In this instance, the level of the input "−" of the comparator 105 becomes lower than that of the input "+" of the comparator during the state 1. The output level of the comparator changes to an H level. Accordingly, the output level of the AND gate 107 also changes to an H level. The RS-FF 109 which has been reset at the initial stage is set by the H level output of the AND gate 107 and now has its output $\bar{Q}$ ($\overline{DPiNH}$) turns to an L level. Therefore, the output of the AND gate 121 remains at an L level and does not cause the LED 123 to light up even when the signal ST3 is produced with the camera shifted to the state 3. This gives a warning to the operator informing him or her that the output of the battery 11 is not normal.

Further, in this instance, the voltage level at the voltage dividing point of the resistors 101 and 102 is a little higher than the voltage KVC. Therefore, the output level of the comparator 104 does not change and remains at an L level. The RS-FF 108 is thus not set and the level of its output $\bar{Q}$ ($\overline{iNHBT}$) becomes an H level during the state 1. When the switch 61*a* is closed, therefore, the output level of the AND gate 110 turns to an H level to set the JK-FF 70 via the OR gate 114. With the JK-FF 70 thus set, there obtains the state 7 and an AF action begins as mentioned in the foregoing. The ensuing operation is the same as the foregoing description and therefore does not require further description here.

When the battery energy has been consumed further, the operation of the camera is as follows: In the battery voltage checking sequential process at the state 1 which follows the power source voltage stabilizing period indicated as the state 0 in FIG. 1, the holding current flows to the magnet 86. The flickering current flows to the iRED 34. These artificial load currents cause the power source voltage Vcc to further drop. Then, if at that time the voltage Vcc reaches a value below the inhibiting level, the camera operates as follows: In this instance, the voltage levels at both the voltage dividing point of the resistors 101 and 102 and that of the resistors 102 and 103 become lower than the standard voltage KVC. Accordingly, the levels of both the comparators 104 and 105 change to an H level. The RS-FF's 108 and 109 are set. The levels of their outputs Q and $\bar{Q}$ change to an H level and to an L level respectively. The voltage conditions at the above-stated voltage dividing points are latched. This causes the signal $\overline{DPiNH}$ to become an L level. The AND gate 121 closes. The LED 123 does not light up even when the signal ST3 is produced in the state 3 and thus warns the operator beforehand that the battery voltage or the output voltage of the battery 11 is not normal. When the switch 61*a* is closed after that, since the signal iNHBT is latched at an H level and the signal $\overline{iNHBT}$ at an L level, the output levels of the AND gates 110 and 111 respectively become an L level and an H level. The JK-FF's 68 and 69 are therefore reset through the OR gates 112–114. Then, the JK-FF 70 is set. The level of the output P4 of the decoder 71 alone becomes an H level. The signal ST4 is produced from the output terminal of the AND gate 76. The state 3 thus shifts to the state 4. At the time when the signal ST4 is produced, the signal ST4 is not impressed on the input terminal of any of the three JK-FF's 68–70 which are provided for shifting from one state to another. Therefore, the operating sequence of the camera is in repose at the state 4 and none of the above-stated states 7, 2 and 6 obtain. As has been mentioned with reference to FIG. 1, the state 4 represents an END state. Therefore, when the power source voltage is below the inhibiting level, no action of the camera is performed in synchronism with closing of the switch 61*a* after the warning display. Therefore, the camera is prevented from making an erroneous action due to the drop of the output voltage of the power source battery.

In the specific embodiment example which has been described in the foregoing, the current for the iRED 34 and the holding current for the magnet 86 are allowed to flow as load currents at the time of battery voltage check. However, the invention is not limited to that method. The method may be replaced with any other method of allowing a current equivalent to an actual load to flow such as a method of allowing a current to flow to a resistor or the like in accordance with the invention. Further, the camera is arranged to shift to the state 4 with the switch 61*a* closed when the inhibiting signal is produced for inhibiting the operation of the camera. This arrangement may be replaced with another arrangement in which the camera is shifted to the state 4 immediately after completion of the state 1.

The length of the stand-by time of the state 0 for stabilization of the power source is set and adjusted according to the kind and amount of the load of the camera system.

The period of the battery voltage check in the state 1 is set at an adequate length of time for having the power source voltage stabilized after the battery load current is allowed to flow.

In accordance with the present invention, the two determining actions are arranged to be concurrently accomplished as has been described in the foregoing. The invented arrangement simplifies a battery check circuit. Further, since the battery voltage output is arranged to be determined under the same condition, the invented arrangement precludes the possibility of having the inhibiting action performed prior to the warning action. If the inhibiting action is performed prior to the warning action, the operator might be misled to think that the camera operation has been brought to a stop by some unknown reason other than deterioration of the battery. Whereas, in accordance with the present invention, a warning on the deterioration of the battery is always given prior to the inhibiting action. The invention thus enables the operator to correctly know the reason for the operation stoppage without being misled.

Another advantage of the invention resides in that: The load current for battery voltage check is allowed to flow solely during the period of the state 1. Therefore, compared with the prior art method of allowing a load current to continuously flow after the switch 14 is closed, the battery is consumed to a less degree. Further, the detecting action is performed solely in the state 1 and the detection output is arranged to be latched in accordance with the invention. This arrangement effectively prevents an erroneous determination due to load fluctuation incidental to a detecting action.

While the specific embodiment example given in the foregoing is arranged to perform the warning action prior to the inhibiting action, it is to be understood that the object of the invention is attainable also by arranging these actions to be simultaneously performed.

Further, it goes without saying that the invention is applicable not only to a photographic camera but also to other apparatuses.

What we claim:

1. A battery voltage checking apparatus for an electrical system comprising:
   (a) a first detector for producing a first electrical signal indicative of a necessity for replacement of a battery used for the system when the output voltage of the battery drops to a value lower than a first voltage level;
   (b) a second detector for producing a second electrical signal to inhibit operation of the system when the output voltage of the battery drops to a value lower than a second voltage level which is lower than the first voltage level;
   (c) first circuit means functionally connected to the first and second detectors and for causing the first and second detectors simultaneously to detect the output voltage of the battery; and
   (d) memory means for electrically memorizing, during a predetermined length of time assoiacted with an exposure cycle of a camera, the first and second electrical signals produced by the first and second detectors as a result of an operation of said first circuit means; and
   (e) second circuit means connected to the memory means for processihg the memorized first electrical signal before the memorized second electrical signal is processed.

2. A battery voltage checking apparatus according to claim 1, wherein said second circuit means includes:
   (a) annunciating means responsive to the memorized first electrical signal for annunciating the necessity of replacing the battery; and
   (b) inhibiting means for inhibiting operation of the electrical system after annunciation of the first electrical signal.

3. A battery voltage checking apparatus according to claim 2, further including:
   means for operating said inhibiting means after actuating said annunciating means.

4. A battery voltage checking apparatus according to claim 1, wherein said first latching means includes a first flip-flop circuit for memorizing the first electrical signal.

5. A battery voltage checking apparatus according to claim 1, wherein said memory means includes a second flip-flop circuit for memorizing the second electrical signal.

6. A battery voltage detecting apparatus for a camera, comprising:
   (a) a first detector arranged to produce a first electrical signal representative of a change of a battery used for the camera when the output voltage of the battery drops to a value lower than a first voltage level;
   (b) a second detector arranged to produce a second electrical signal for inhibiting operation of the camera when the output voltage of the battery drops to a value lower than a second voltage level which is lower than the first voltage level;
   (c) first circuit means, functionally connected to the first and second detectors for causing the first and second detectors to simultaneously detect the output voltage of the battery a prescribed length of time after said battery is switched on;
   (d) meory means for electrically memorizing the first and second electrical signals produced by the first and second detectors as a result of an operation of said first circuit means; and
   (e) second circuit means, connected to the first and second detectors, for processing the first electrical signal before the second electrical signal is processed.

7. A battery voltage detecting apparatus according to claim 6, wherein said first circuit means includes a first switch member to cause the preparation in circuit to control said camera, and said second circuit means includes a second switch member to cause the commencement of the photographic operation in said camera.

* * * * *

UNITED STATES PATENT AND TRADEMARK OFFICE
CERTIFICATE OF CORRECTION

PATENT NO. : 4,547,770

DATED : October 15, 1985

INVENTOR(S) : Ryoichi Suzuki, et al

It is certified that error appears in the above-identified patent and that said Letters Patent is hereby corrected as shown below:

In the heading of the patent it should read as follows:

-- [30]  Foreign Application Priority Data

Jul. 8, 1982 [UP]    Japan .............57-119491 --

Signed and Sealed this

Fifteenth Day of July 1986

[SEAL]

Attest:

DONALD J. QUIGG

Attesting Officer

Commissioner of Patents and Trademarks